United States Patent [19]

Takeuchi

[11] Patent Number: 5,481,485
[45] Date of Patent: Jan. 2, 1996

[54] EFFECTIVE CHANNEL LENGTH SIMULATION USING A SINGLE SAMPLE TRANSISTOR

[75] Inventor: Kiyoshi Takeuchi, Tokyo, Japan

[73] Assignee: NEC Corporation, Japan

[21] Appl. No.: 445,578

[22] Filed: May 22, 1995

Related U.S. Application Data

[62] Division of Ser. No. 99,062, Jul. 29, 1993, abandoned.

[30] Foreign Application Priority Data

Jul. 30, 1992 [JP] Japan .................................. 4-203668

[51] Int. Cl.$^6$ ...................................................... G06F 17/00
[52] U.S. Cl. .............................. 364/578; 437/40; 257/213
[58] Field of Search .................................... 364/578, 488, 364/489; 371/23; 257/213; 437/40

[56] References Cited

U.S. PATENT DOCUMENTS

| | | | |
|---|---|---|---|
| 4,791,593 | 12/1988 | Hennion | 364/578 |
| 4,939,681 | 7/1990 | Yokomizo et al. | 364/578 |
| 5,047,971 | 9/1991 | Horwitz | 364/578 |
| 5,257,200 | 10/1993 | Machala, III | 364/488 |
| 5,265,028 | 11/1993 | Machala, III | 364/488 |
| 5,424,964 | 6/1995 | Machala, III | 364/578 |

OTHER PUBLICATIONS

Karlsson et al., "An Efficient Parameter Extraction Algorithm for MOS Transistor Models", *IEEE Trans on Elect. Dev.*, Sep. 1992, pp. 2070–2075.
McAndrew et al., "MOSFET Effective Channel Length, Thresh. Voltage, a Series Resist. Determination by Robust Opt." *IEEE Trans on Elect. Dev.*, Oct. 1992, pp. 2298–2311.
Chung et al., "Performance & Reliability Design, Issues for Deep–Submic. MOSFETS", *IEEE Trans on Elect Dev.*, Mar. 1991, pp. 545–552.
Lemaitre, "An Improved Analytical LDD–MOSFET Model for Digital & Analog Circuit Simulation for All Channel Length, Down to Deep–Submicron", Sep. 9, 1991, pp. 12.3.1–12.3.4.
Bhattacharya et al., "Accuracy of Channel Resistance & Current Gain Methods of Leff Extraction", Mar. 1994, pp. 195–197.
Takeuchi et al., "A New Effective Channel Length Determination Method", Mar. 1991, pp. 215–220.
McAndrew et al., "MOSFET Effective Channel Length, Threshold Voltage, & Series Resistance Determination by Robust Optimization", Oct. 1992, 99. 2298–2311.
Ng et al., "Measuring the Effective Length of MOSFETS", Nov. 1990, pp. 33–38.
Guo et al., "A New Approach to Determine the Effective Channel Length & the Drain–and–Source Series Resistance of Minaturized MOSFET's", Oct. 1994, pp. 1811–1818.

*Primary Examiner*—Ellis B. Ramirez
*Assistant Examiner*—Patrick J. Assouad
*Attorney, Agent, or Firm*—Laff, Whitesel, Conte & Saret, Ltd.

[57] ABSTRACT

In a device simulation apparatus, the structural parameters of a single sample field effect transistor are retrieved from a memory and a set of voltage parameters is established. A source-drain current value and a potential distribution are derived from the structural parameters. A source-drain resistance value is then derived from the source-drain current value and one of the voltage parameters and a channel resistivity value is derived from the potential distribution and the source-drain current value. One of the voltage parameters is successively updated to repeat the process on the updated parameter to produce a said plurality of source-drain current values and a plurality of channel resistivity values. The effective channel length of the transistor is determined from the source-drain resistance values and the channel resistivity values.

6 Claims, 3 Drawing Sheets

EFFECTIVE CHANNEL LENGTH SIMULATION USING A SINGLE SAMPLE TRANSISTOR

This application is a division of application Ser. No. 08/099,062, filed Jul. 29, 1993 (now abandoned).

BACKGROUND OF THE INVENTION

1. Field of the Invention

The present invention relates generally to simulation apparatus, and more specifically to a device simulation technique for determining the effective channel length of a field effect transistor.

2. Description of the Related Art

The effective channel length of a field effect transistor is an important parameter that characterizes the electrical performance of the transistor. Accurate measurement of the effective channel length is important for implementation of precision devices. Due to the presence of ambiguous factors associated with the boundaries between the gate electrode and the source and drain electrodes and due to product variabilities, the effective channel length of each transistor differs uniquely from the design value which is usually determined by the physical length of the gate. Measurement of the effective channel length by using a source-drain resistance R and its relation to a channel resistivity r and an external resistance $R_{EXT}$ is known. According to this method, the following relation holds for a linear region of a field effect transistor where the drain voltage is sufficiently low:

$$R = r \times L_{EFF} + R_{EXT} \quad (1)$$

$L_{EFF}$ is the effective channel length of a field effect transistor and is given by the relation $$L_{EFF} = L_{GATE} - \Delta L \quad (1a)$$

where $L_{GATE}$ represents the physical length of the gate, and $\Delta L$ is a deviation of the effective channel length $L_{EFF}$ from the gate length $L_{GATE}$ and is assumed to be constant. The channel resistivity r varies with the source-gate voltage and substrate-source voltage of the device while the external resistance $R_{EXT}$ is assumed to be constant. Source-drain resistances of several field effect transistors having different gate lengths are measured by applying a constant source-gate voltage. Plotting the measured resistances R as a function of the gate lengths $L_{GATE}$ of these transistors causes them to adopt a line having a gradient corresponding to the channel resistivity r. By varying the source-gate voltage and making measurements of source-drain resistances R on these sample transistors, a plurality of lines of different gradients are produced. As shown in FIG. 1, these lines intersect at a point which is uniquely determined by a set of $\Delta L$ and $R_{EXT}$. Using the $\Delta L$ value, the effective channel length is determined.

The above-mentioned measurement method is also employed in the current device simulation technique to permit performance evaluation and to achieve low-cost development of large scale integrated chips. However, due to the use of a plurality of different sample transistors the current simulation technique requires a large amount of data to be processed, resulting in a long processing time.

SUMMARY OF THE INVENTION

It is therefore an object of the present invention to provide an improved device simulation apparatus that permits the effective channel length of the field effect transistor to be determined in a short period of time by the use of a singe sample transistor.

According to the present invention, there is provided a simulation apparatus which comprises storage means for storing structural parameters of a field effect transistor, first means for reading the structural parameters and deriving therefrom a plurality of source-drain current values and a plurality of potential distributions corresponding to a plurality of successive sets of voltage parameters, one of the voltage parameters of each of the sets differing from a corresponding voltage parameter of adjacent sets, second means for deriving a plurality of source-drain resistance values respectively from the source-drain current values and one of the voltage parameters and deriving a plurality of channel resistivity values respectively from the potential distributions and the source-drain current values; and third means for deriving an effective channel length from the source-drain resistance values and the channel resistivity values.

In one embodiment, the effective channel length is derived from the relation $(R_j - R_k)/(r_j - r_k)$, where $R_j$ and $R_k$ represent the source-drain resistance values, respectively, and $r_j$ and $r_k$ represent the channel resistivity values, respectively, the integers j and k corresponding respectively to arbitrarily chosen sets of the voltage parameters.

BRIEF DESCRIPTION OF THE DRAWINGS

The present invention will be described in further detail with reference to the accompanying drawings, in which.

DETAILED DESCRIPTION

Figure 1:
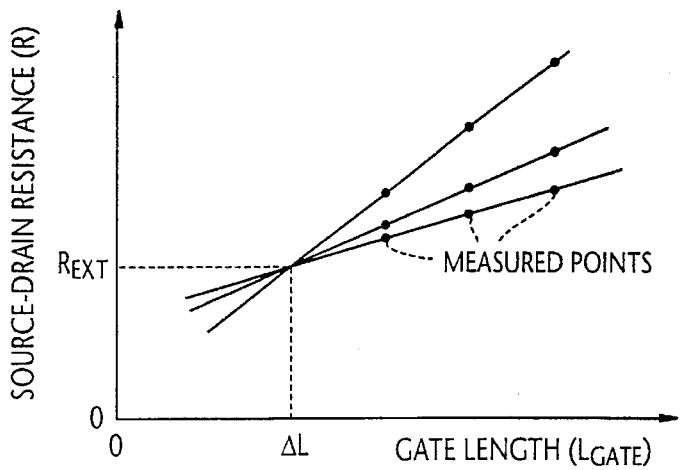
FIG. 1 is a graphic representation of a prior art simulation method for the determination of effective channel length of field effect transistors.

Referring now to FIG. 1, there is schematically shown an effective channel length simulator according to the present invention. The device simulator is comprised by a keyboard 1, a data processor 2, a memory 3 and an output device 4 such as display or a printer. The data processor 2 includes a source-drain current/potential distribution calculation (SDC/PD) unit 5, a resistance calculation unit 6 and an effective channel length calculation unit 7. The structure of a device such as MISFET is divided into a matrix of rows and columns and each intersection of the matrix is described in terms of the quality of its material as well as its impurity concentration and stored in the memory 3. Such structural data may be obtained by the use of a process simulator that is used in manufacturing process for tracking and reconstructing manufacturing processes, or by keying structural parameters from the keyboard 1.

Figure 2:
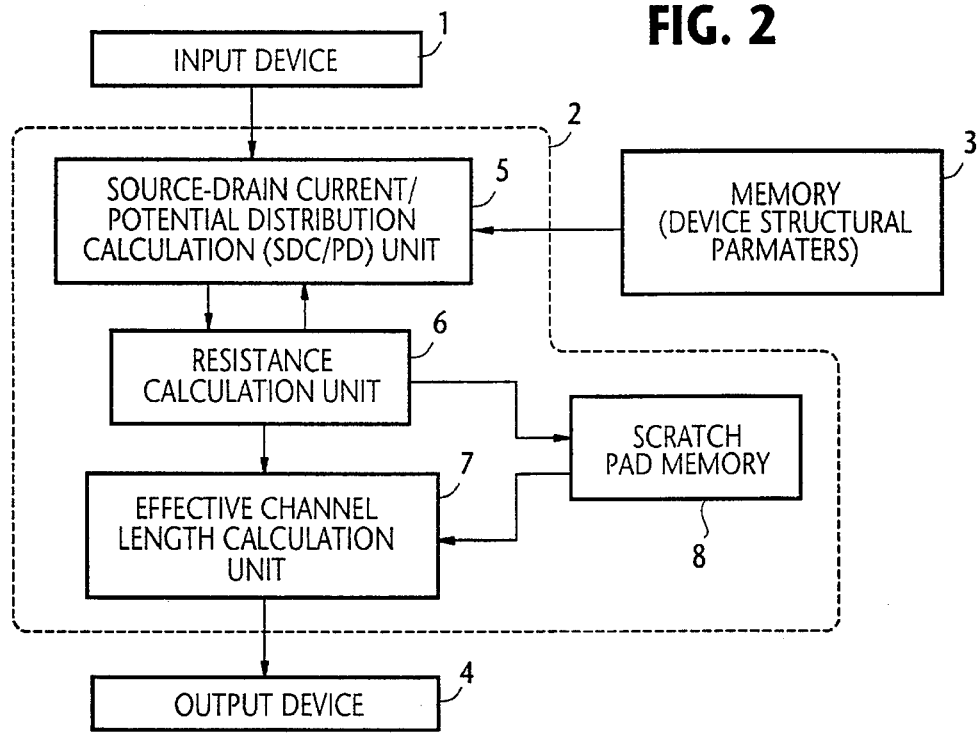
FIG. 2 is a block diagram of a simulation apparatus of the present invention.

The operation of the device simulator is described in a flowchart shown in FIG. 2. At step 21, the SDC/PD unit 5 retrieves structural data of a field-effect transistor from memory 3 and a variable i is set equal to 1 at step 22 and provides voltage setting on the drain-source voltage $V_{DS}$, gate-source voltage $V_{GS}$, and substrate-source voltage $V_{BS}$ at step 23. At step 24, the SDC/PD unit 5 derives a distribution of electron density (n), hole density (p) and potentials ($\psi$) with respect to the center of bandgap of the device for channel carriers (electrons for n-channel devices and holes for p-channel devices) using the following Poisson Equation (2), electron and hole preservation Equations (3) and (4):

$$div(\epsilon \cdot grad\ \psi) = -q(p-n+N_D-N_A) \qquad (2)$$

$$div(+\mu_N \cdot n \cdot grad\ \psi - D_N \cdot grad\ n) = GR_N \qquad (3)$$

$$div(-\mu_p \cdot p \cdot grad\ \psi - D_p \cdot grad\ p) = Gr_p \qquad (4)$$

where, $\epsilon$=dielectric constant;
q=charge quantity;
$N_D$=donor's impurity concentration;
$N_A$=acceptor's impurity concentration;
$\mu_N$=electron mobility;
$D_N$=electron mobility;
$D_N$=electron diffusion coefficient;
$GR_N$=amount of electrons generated per unit time;
$\mu_p$=hole mobility;
$D_p$=hole diffusion coefficient; and
$GR_p$=amount of holes generated per unit time.

These Equations are converted to discrete values corresponding to the intersections of a mesh which do not necessarily match to the intersections of the mesh described in the structure of the device and solved for the drain current $I_D$ by giving boundary conditions corresponding to the voltages established at step 23.

A drain current $I_D$ of the transistor is then calculated by the SDC/PD unit 5 at step 25 as follows:

$$I_D = \int (-q \cdot \mu_N \cdot n \cdot grad\ \psi + q \cdot D_N \cdot grad\ n) dS$$

$$+ \int (-q \cdot \mu_p \cdot p \cdot grad\ \psi + q \cdot D_p \cdot grad\ p) dS \qquad (5)$$

where S represents an area that covers the drain electrode of the device.

Quasi-Fermi levels ($\phi_N$, $\phi_p$) for electrons and holes of the device are derived by the SDC/PD unit 5 at step 26 from the potential distribution $\psi$ and the carrier density distributions (n,p) according to the following Equations:

$$\phi_N = \psi - (K_B\ T/q) \times ln(n/n_i) \qquad (6)$$

$$\phi_p = \psi + (K_B\ T/q) \times in(p/n_i) \qquad (7)$$

where, $K_B$ is the Boltzmann constant, T the absolute temperature, and $n_i$ the intrinsic carrier concentration. The above-mentioned Equations are known in the device simulation art as a drift diffusion model. Other simulation methods could also be employed for the present invention, such as the Monte Carlo method (which involves tracking of the movement of particles as a function of time) and the energy transport method (which is an extension of the drift diffusion method by taking into account the law of preservation of energy).

Figure 6:
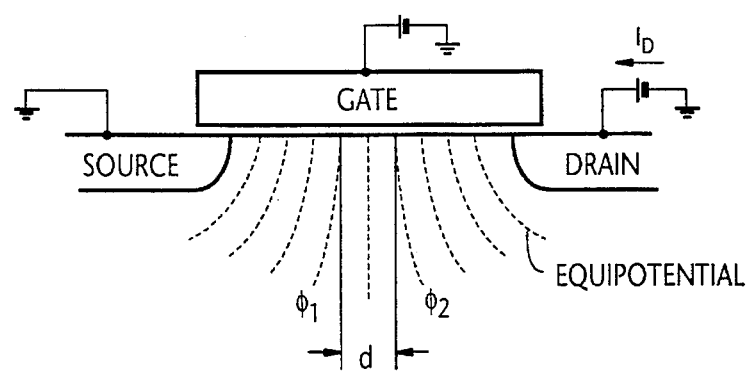
FIG. 6 is a cross-section of a field effect transistor showing it internal potential distribution.
Figure 3:
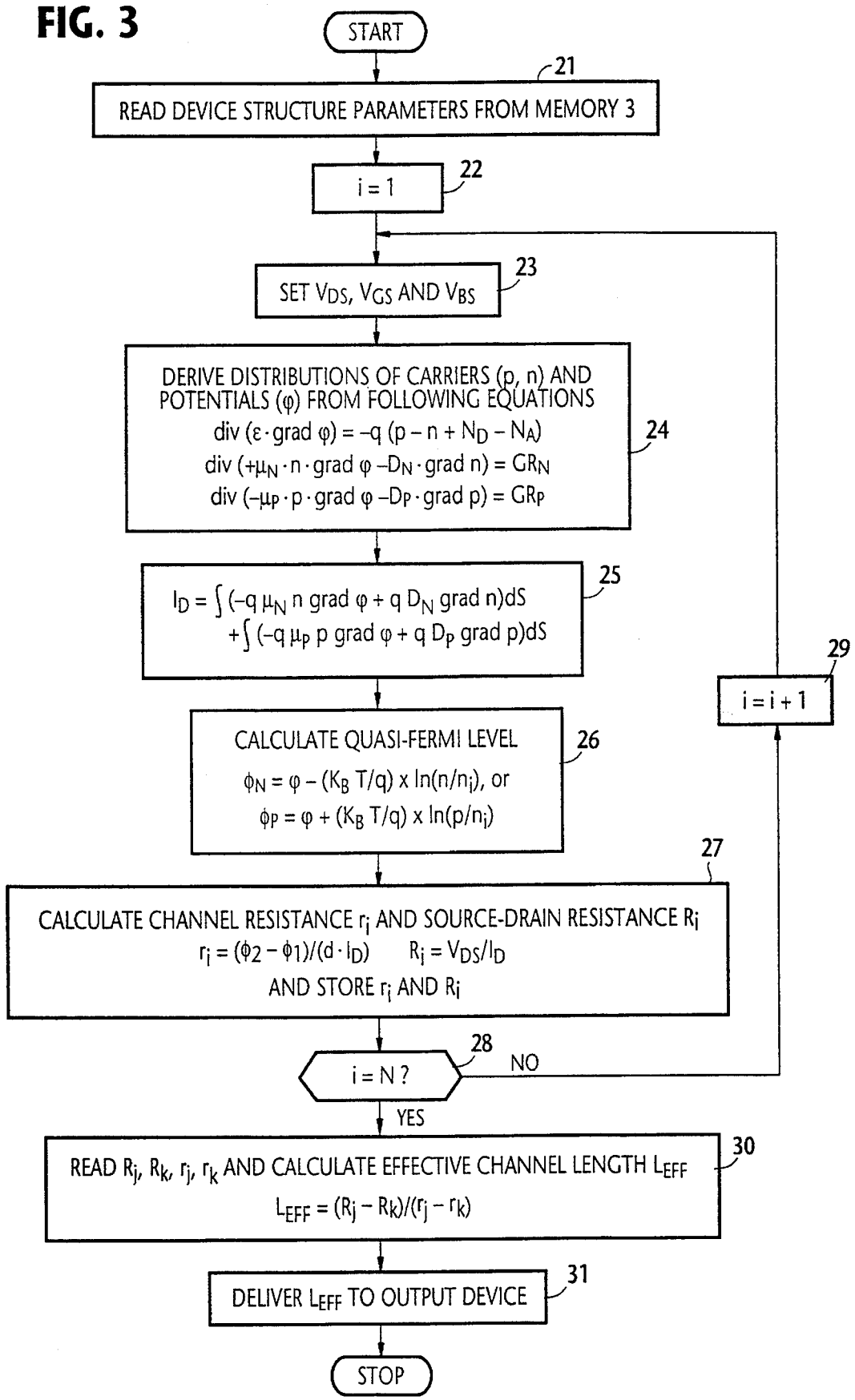
FIG. 3 is a flowchart describing the operation of the simulation apparatus of FIG. 2.

The results of calculations $\phi_N$ ($\phi_p$) and $I_D$ are supplied to the resistance calculation unit 6 of the data processor. The resistance calculation unit 6 derives a channel resistance (r) at step 27 by dividing the spatial potential gradient of the quasi-Fermi level $\phi_N$ ($\phi_p$) at arbitrary points 1 and 2 (see FIG. 6) along the source-to-drain channel by the drain current $I_D$. Equation (8) gives the channel resistance (r):

$$r = (\phi_2 - \phi_1)/(d \cdot I_D) \qquad (8)$$

where $\phi_2$ and $\phi_1$ are quasi-Fermi levels at points 1 and 2 and d is the length (or unit length) between points 1 and 2. It is desirable that points 1 and 2 be selected from an area where the potential gradient is constant and parallel to the substrate surface of the device. This channel resistance is stored in a scratch pad memory 8 as $r_i$. The resistance calculation unit 6 then calculates a source-drain resistance $R_i = V_{DS}/I_D$ and stores $R_i$ in memory 8.

Control advances to step 28 to check to see if the variable i is equal to N which is an arbitrary number. If the answer is negative, control branches to step 29 to increment the variable i by one and returns to step 23. Therefore, control is shifted from the resistance calculation unit 6 to the SDC/PD unit 5. The SDC/PD unit 5 resets at step 23 the voltage parameters by varying at least one of the voltage parameters ($V_{GS}$, $V_{BS}$) by a predetermined amount while keeping the voltage parameter $V_{DS}$ constant. In a typical example, the source-drain voltage parameter $V_{DS}$ is maintained at 0.05 volts, the substrate-source voltage parameter $V_{BS}$ is kept constant at 0 volt, and the gate-source voltage is varied by an increment of 1 volt from 1 to 3 volts. Alternatively, the voltage parameter $V_{DS}$ is held constant at 0.05 volts, the substrate-source voltage parameter $V_{BS}$ is varied with a decrement of 1 volt from 0 to −2 volts and the gate source voltage $V_{GS}$ is kept constant at 3 volts.

The above process is repeated on a successively updated set of voltage parameters until variable i becomes equal to N. When i=N, the results of the resistance calculation unit 6 are supplied to the effective channel length calculation unit 7. Since the source-drain resistance value $R_i$ varies as a function of the effective channel length $L_{EFF}$ and adopts a line having a gradient $r_i$, it is represented by the relation $R_i = r_i \cdot L_{EFF} + R_{EXT}$. Therefore, the effective channel length $L_{EFF}$ of the device can be obtained from the intersection of two lines represented by $R_j = r_j \cdot L_{EFF} + R_{EXT}$ and $R_k = r_k \cdot L_{EFF} + R_{EXT}$, respectively (where j and k are arbitrary numbers). The intersection of these lines is determined as follows:

$$L_{EFF} = (R_j - R_k)/(r_j - r_k) \qquad (9)$$

The effective channel length calculation unit 7 reads at step 30 source-drain resistance values $R_j$, $R_k$ and channel resistance values $r_j$, $r_k$ from memory 8 and calculates Equation (9) to determine the effective channel length. Preferably, step 30 is repeatedly executed by varying the integers j and k so that different sets of source-drain resistance values and channel resistance values are read from memory 8 and effective channel length values are calculated. If consistent values are obtained for the effective channel length, the latter can be determined with a high degree of reliability. The Control now proceeds to step 31 to deliver the determined effective channel length to the output device 4 and terminates the program execution.

Figure 4:
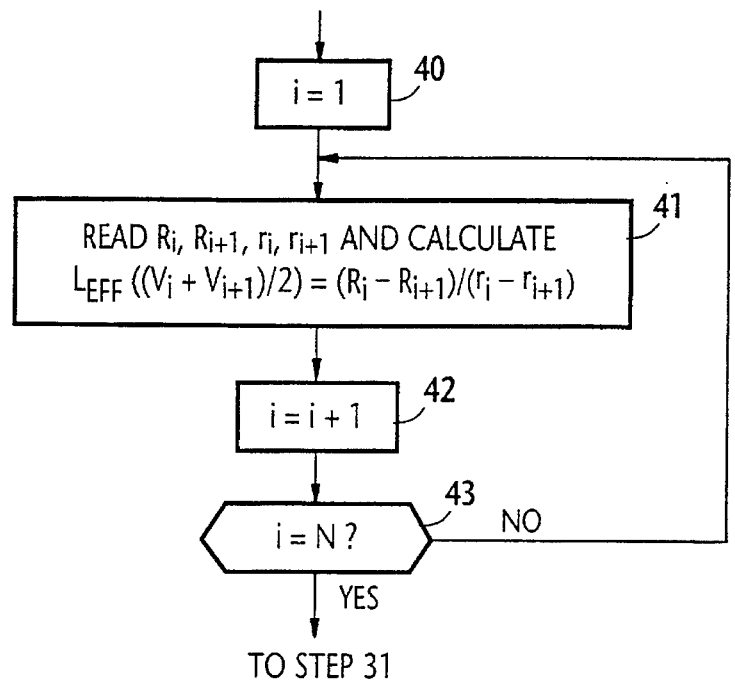
FIGS. 4 and 5 are flowcharts describing modified forms of effective channel length calculation.

If consistent values are not obtained for the effective channel length, an effective channel length calculation routine shown in FIG. 4 can be used instead of step 30. Such inconsistencies may occur due to the fact that the values $L_{EFF}$ and $R_{EXT}$ are not necessarily constant, particularly for lightly doped drain (LDD) devices where the impurity concentration is not ideally steep at the boundary between the channel and the source as well as at the boundary between the channel and the drain. The calculation of FIG. 4 is based on the assumption that the effective channel length is variable as a function of applied voltages ($V_{GS}$ or $V_{BS}$) and is determined by ($V_i + V_{i+1}$)/2.

When control exits from step 28, the effective channel length calculation unit 7 sets the variable i to 1 at step 40 and proceeds to step 41 to read source-drain resistance values $R_i$, $R_{i+1}$ and channel resistance values $r_i$, $r_{i+1}$ from memory 8 and calculates the following Equation:

$$L_{EFF}((V_i + V_{i+1})/2) = (R_i - R_{i+1})/(r_i - r_{i+1}) \qquad (10)$$

where $V_i$ and $V_{i+1}$ are gate-source (or substrate-source) voltages of slightly different values. Control proceeds to step 42 to increment the variable i by 1 and determines whether it is equal to N at step 43. If the answer is negative, control branches at step 43 to step 41 to repeat the process until i =N, whereupon (N−1) values are obtained for the effective channel length of the sample transistor.

Figure 5:
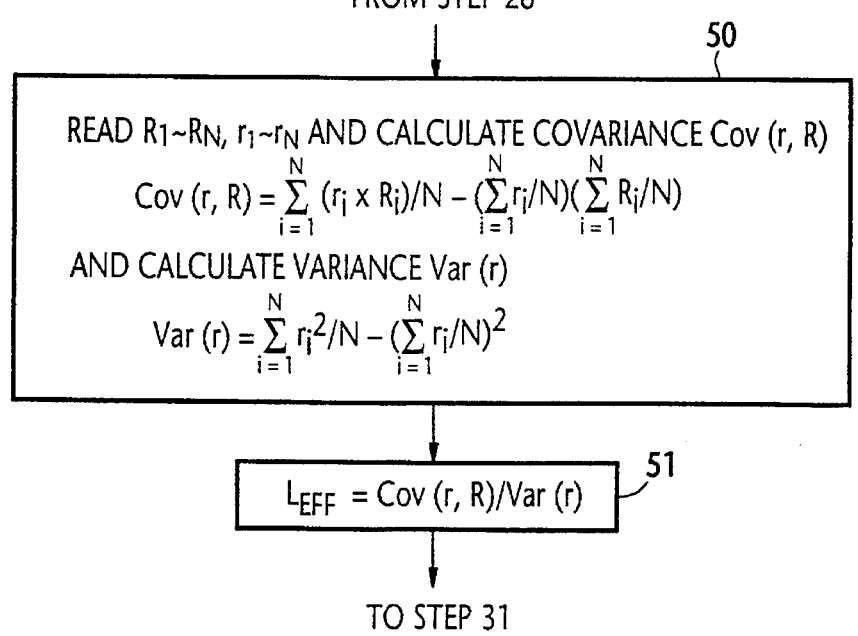

FIG. 5 shows a further modification of the effective channel length calculation that is particularly useful for LDD devices. In this modification, it is assumed that effective channel length is constant but external resistance $R_{EXT}$ is variable as a function of an applied voltage. The effective channel length is determined such that the voltage dependency of the external resistance is reduced to a minimum. According to this method, the effective channel length calculation unit 7 reads at step 50 all source-drain resistance values $R_1$ through $R_N$ and all channel resistance values $r_1$ through $r_N$, from memory 8 and calculates covariance and variance according to Equations (11) and (12), respectively:

$$Cov(r,R) = \sum_{i=1}^{N} (r_i R_i)/N - \left( \sum_{i=1}^{N} r_i/N \right) \left( \sum_{i=1}^{N} R_i/N \right) \quad (11)$$

$$Var(r) = \sum_{i=1}^{N} r_i^2/N - \left( \sum_{i=1}^{N} r_i/N \right)^2 \quad (12)$$

and determines at step 51 the effective channel length as follows:

$$L_{EFF} = Cov(r,R)/Var(r) \quad (13)$$

Since the effective channel length of a field effect transistor is determined from structural parameters of a single sample transistor by successively operating it under a different set of voltage parameters and deriving a plurality of source-drain resistance values and a plurality of channel resistivity values corresponding respectively to the sets of voltage parameters, the time taken to produce the result is reduced to one half of the time taken by the current simulation apparatus where the effective channel length simulation is based on the structural parameters of a plurality of field effect transistors.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A method for manufacturing a field effect transistor having a desired effective channel length, the method comprising the steps of:

(a) selecting a single sample transistor;

(b) measuring the sample transistor in terms of manufacturing process parameters to provide structural data;

(c) converting the structural data into an effective channel length by:

(c1) determining a plurality of source-drain current values and a plurality of potential distributions corresponding to a plurality of successive sets of voltage parameters, wherein one of the voltage parameters of each of the sets differs from a corresponding voltage parameter of adjacent sets;

(c2) determining channel resistivity values corresponding to said plurality of source-drain current values and said plurality of potential distribution, and determining source-drain resistance values corresponding to a plurality of drain-source voltages and source-drain currents; and (c3) finding an effective channel length based upon said channel resistivity values and said source-drain resistance values;

(d) comparing the effective channel length with the desired effective channel length;

(e) adjusting the manufacturing process parameters; and (f) repeating steps (a) through (e) until the effective channel length found by said measuring and the desired effective channel length differ by, at most, a predetermined allowable error.

2. The method in accordance with claim 1, wherein the manufacturing process parameters are selected from the group consisting of semiconductor material quality, donor impurity concentration and acceptor impurity concentration.

3. The method in accordance with claim 1, wherein the step of finding an effective channel length is based upon the relationship $$L_{EFF} = (R_j - R_k)/(r_j - r_k),$$

where $L_{EFF}$ is effective channel length, $R_j$ and $R_k$ represent source-drain resistance values, $r_j$ and $r_k$ represent channel resistivity values, and integers j and k correspond to the different sets of voltage parmeters.

4. The method in accordance with claim 1, wherein the transistor is a lightly doped drain (LDD) device, and the step of finding the effective channel length is based upon varying the applied voltages while searching for the effective channel length.

5. The method in accordance with claim 1, wherein the step of finding the effective channel length is based upon the relation $$L_{EFF} = Cov(r,R)/Var(r),$$

where $Cov(r,R)$ is the covariance of channel resistivity with respect to source drain resistance, and $Var(r)$ is the variance of channel resistivity, with $$Cov(r,R) = \sum_{i=1}^{N} (r_i R_i)/N - \left( \sum_{i=1}^{N} r_i/N \right) \left( \sum_{i=1}^{N} R_i/N \right)$$

$$Var(r) = \sum_{i=1}^{N} r_i^2/N - \left( \sum_{i=1}^{N} r_i/N \right)^2$$

where i is a variable in the range between 1 and N, where N is the total number of sets of voltage parameters, $r_i$ represents each one of the channel resistivity values, and $R_i$ represents each one of the source-drain resistance values.

6. The method in accordance with claim 1, wherein the step of adjusting the manufacturing process parameters comprises adjusting at least one in a group consisting of semiconductor material quality, donor impurity concentration, and/or acceptor impurity concentration.

* * * * *